United States Patent
Morton

(10) Patent No.: US 12,166,332 B2
(45) Date of Patent: Dec. 10, 2024

(54) ULTRA-LOW NOISE, HIGHLY STABLE SINGLE-MODE OPERATION, HIGH POWER, BRAGG GRATING BASED SEMICONDUCTOR LASER

(71) Applicant: ColdQuanta, Inc.

(72) Inventor: Paul A Morton, West Friendship, MD (US)

(73) Assignee: ColdQuanta, Inc., Boulder, CO (US)

( * ) Notice: Subject to any disclaimer, the term of this patent is extended or adjusted under 35 U.S.C. 154(b) by 826 days.

(21) Appl. No.: 17/220,736

(22) Filed: Apr. 1, 2021

(65) Prior Publication Data

US 2021/0305781 A1    Sep. 30, 2021

Related U.S. Application Data

(63) Continuation of application No. 16/519,740, filed on Jul. 23, 2019, now Pat. No. 11,005,233, which is a
(Continued)

(51) Int. Cl.
| | |
|---|---|
| H01S 5/14 | (2006.01) |
| H01S 5/02 | (2006.01) |
| H01S 5/024 | (2006.01) |
| H01S 5/026 | (2006.01) |
| H01S 5/028 | (2006.01) |
| H01S 5/06 | (2006.01) |
| H01S 5/065 | (2006.01) |

(Continued)

(52) U.S. Cl.
CPC .............. *H01S 5/146* (2013.01); *H01S 5/021* (2013.01); *H01S 5/02415* (2013.01); *H01S 5/02438* (2013.01); *H01S 5/02476* (2013.01); *H01S 5/0264* (2013.01); *H01S 5/028* (2013.01); *H01S 5/0612* (2013.01); *H01S 5/0654* (2013.01); *H01S 5/0687* (2013.01); *H01S 5/1039* (2013.01); *H01S 5/1212* (2013.01); *H01S 5/1225* (2013.01); *H01S 5/125* (2013.01); *H01S 5/141* (2013.01); *H01S 2301/163* (2013.01)

(58) Field of Classification Search
CPC ........ H01S 5/146; H01S 5/021; H01S 5/0264; H01S 5/0687; H01S 5/1039; H01S 5/141
See application file for complete search history.

(56) References Cited

U.S. PATENT DOCUMENTS

| | | | |
|---|---|---|---|
| 6,480,513 B1 * | 11/2002 | Kapany | H01S 5/146 372/64 |
| 6,647,029 B1 * | 11/2003 | Okazaki | H01S 5/146 372/105 |

(Continued)

*Primary Examiner* — Yuanda Zhang
(74) *Attorney, Agent, or Firm* — Young Basile Hanlon & MacFarlane, P.C.

(57) ABSTRACT

Waveguide Bragg gratings, optical reflectors and lasers including optical reflectors are disclosed. The optical reflectors include a waveguide, perturbations proximate to the waveguide to create a Bragg grating in the waveguide, and a DC index control structure positioned to vary the DC index along at least a portion of the Bragg grating. In laser embodiments, the waveguide may be coupled to the second end of a semiconductor gain element to form an external cavity having an optical length and a cavity phase. The gain element and optical reflector may be monolithically integrated on a substrate or separate structures.

20 Claims, 12 Drawing Sheets

Related U.S. Application Data continuation-in-part of application No. 16/246,820, filed on Jan. 14, 2019, now Pat. No. 10,454,248, and a continuation-in-part of application No. 16/237,643, filed on Dec. 31, 2018, now Pat. No. 10,483,718, and a continuation-in-part of application No. 16/237,646, filed on Dec. 31, 2018, now Pat. No. 10,476,233, which is a continuation of application No. 15/683,380, filed on Aug. 22, 2017, now Pat. No. 10,193,306, said application No. 16/237,643 is a continuation of application No. 15/683,380, filed on Aug. 22, 2017, now Pat. No. 10,193,306, said application No. 16/246,820 is a continuation of application No. 15/683,380, filed on Aug. 22, 2017, now Pat. No. 10,193,306.

(60) Provisional application No. 62/377,760, filed on Aug. 22, 2016.

(51) Int. Cl.
- *H01S 5/0687* (2006.01)
- *H01S 5/10* (2021.01)
- *H01S 5/12* (2021.01)
- *H01S 5/125* (2006.01)

(56) References Cited

U.S. PATENT DOCUMENTS

| | | | |
|---|---|---|---|
| 2006/0023999 A1* | 2/2006 | Chiaretti | G02B 6/022 385/10 |
| 2009/0290613 A1* | 11/2009 | Zheng | H01S 5/146 372/99 |
| 2012/0057079 A1* | 3/2012 | Dallesasse | H01S 5/0261 348/724 |
| 2015/0147020 A1* | 5/2015 | Kondo | H01S 5/141 385/10 |

* cited by examiner

ULTRA-LOW NOISE, HIGHLY STABLE SINGLE-MODE OPERATION, HIGH POWER, BRAGG GRATING BASED SEMICONDUCTOR LASER

CROSS REFERENCE TO RELATED APPLICATIONS

This application is a continuation of U.S. Non-Provisional application Ser. No. 16/519,740 filed Jul. 23, 2019, which is a continuation-in-part of U.S. Non-Provisional application Ser. No. 16/237,643 filed Dec. 31, 2018, Ser. No. 16/237,646 filed Dec. 31, 2018, and Ser. No. 16/246,820 filed Jan. 14, 2019, which are continuations of U.S. Non-Provisional application Ser. No. 15/683,380 filed on Aug. 22, 2017, which claims priority to and the benefit of U.S. Provisional Patent Application No. 62/377,760 filed on Aug. 22, 2016, all of which are incorporated by reference in their entireties.

BACKGROUND OF THE INVENTION

Field of the Invention

This invention relates generally to semiconductor lasers, and more particularly to ultra-low noise, narrow-linewidth, highly stable single-longitudinal-mode operation, high power, Bragg grating based semiconductor lasers.

Background Art

Lasers with an ultra-low noise, including narrow linewidth operation, e.g. ~1 kHz down to 1 Hz linewidth, are often required to support high performance optical communication systems and sensing systems, as well as low relative intensity noise (RIN) operations, e.g. <−155 dB/Hz. High power is also required for use in high performance systems without the need for optical amplification, or for limited booster amplification, with power levels from e.g. 50 mW up to 200 mW being required. Operating wavelengths can include a very wide range, ranging from ultraviolet (UV) e.g. 250 nm out to many microns, e.g. >10 microns.

Existing low-noise, narrow linewidth lasers such as solid-state lasers and fiber lasers have large size, large cost, limited operating wavelength ranges, and they are often unreliable and not suited for wide-scale commercial deployment. Semiconductor lasers have proven to be the best solution for wide-scale commercial deployment because they leverage the benefits of the semiconductor manufacturing process. Existing semiconductor-based laser systems cannot adequately support high performance systems with all the above requirements. Therefore, there is a continuing need for an ultra-low noise, highly stable single mode operation, and high power semiconductor-based laser to meet this long-felt need. In addition, future mass market applications will require even higher volume and lower cost manufacturing of higher performance lasers.

The following novel concepts according to embodiments of the present invention provide an ultra-low noise, highly stable single mode operation, high power, semiconductor-based external cavity laser (ECL), also described as an Extended-Distributed Bragg Reflector (E-DBR) laser. Single mode operation specifically refers to single-longitudinal mode or single-frequency operation consistent with a narrow linewidth laser. The concepts are applicable to both a hybrid integrated version using a Bragg grating based reflector and separate gain chip, or an integrated laser (monolithic or heterogeneously integrated).

BRIEF SUMMARY OF THE INVENTION

To create an ultra-low phase (or frequency) noise laser, characterized by a very narrow linewidth as well as very small low-frequency phase (frequency) noise, the laser cavity should have a very long photon lifetime; that is, a long cavity and a high storage of photons compared to the number of photons leaving the cavity. Therefore, the first concept used in the basic design of this ultra-low noise laser according to an embodiment is to use a long external cavity to reduce the noise, linewidth, etc. The effects of using a long external cavity in laser are described in Refs. [1]-[3].

Using a broadband reflector with a long external cavity produces a narrow linewidth laser, however, the laser is not stable and is unlikely to operate in a single mode, and will generally mode-hop (jump) between different possible laser cavity modes with only small gain differences; this is the approach taken by many other researchers. In order to provide single mode operation, a grating, such as a fiber Bragg grating (FBG), or a planar waveguide based Bragg grating, can be used to provide the feedback; the Bragg grating provides a narrow reflection bandwidth, and provides mode control so that single mode operation can be achieved.

Semiconductor lasers have their linewidth increased due to the alpha factor, $\alpha$, also known as the linewidth enhancement factor, which increases the Schawlow Townes linewidth by a factor $(1+\alpha^2)$, and so a low alpha factor will reduce the linewidth of such a laser (see Refs. [1] and [2]). The future use of a semiconductor gain element with a quantum dot (QD) active region, which can have a very low or even zero alpha factor, can be used to further reduce the linewidth of a semiconductor-based laser.

An important concept for reducing the laser linewidth is operation on the high-slope, long wavelength side of a grating reflector. This takes advantage of an effect described in Refs. [3]-[5], often called "Detuned Loading", as described in those references; the use of a frequency dependent loss mechanism (e.g. a dispersive loss), together with the alpha-factor of the laser (the linewidth enhancement factor), to simultaneously increase the modulation bandwidth of the laser while reducing the chirp and noise. The long wavelength slope of the grating has the correct sign to work with the alpha-factor to reduce noise and make the laser stable. The opposite happens on the short wavelength side of the grating. An increased value of the frequency dependent loss (higher slope) has a strong effect in reducing noise, leading to designs with long gratings that have very high slope and very narrow bandwidth.

In the design of hybrid-integrated laser according to an embodiment, all the design requirements are achieved at the same time; long cavity, detuned loading, and excellent mode selectivity, through very careful grating and laser cavity design. By designing the laser to operate with an extended single mode operating range, the lasing mode can be set to be on the long wavelength slope of the grating, by controlling the cavity phase; the larger the single mode range, the further to the long wavelength side the laser will operate, providing a lower linewidth output.

Using the design concepts described in the above embodiments, a laser cavity design including a high power gain chip (i.e. longer gain chip, such as 1-3 mm long) and an FBG external cavity can be achieved, with a high coupling efficiency fiber lens placed close to the FBG to couple light from the gain chip to the FBG efficiently.

One embodiment of the present invention provides a laser including: a semiconductor gain chip; an external cavity; and a first thermally conductive baseplate; wherein a first end of the gain chip has a high reflectivity facet forming a first end of the laser cavity; a second end of the gain chip has an low reflectivity facet, allowing light generated from the gain chip to be coupled with a first end of the external cavity; and a second part of the external cavity includes a Bragg grating which forms the second end of the laser cavity, supported by the first thermally conductive baseplate, the temperature of the Bragg grating being maintained through a feedback loop comprising a first thermoelectric cooler (TEC) and a first thermistor attached to the first thermally conductive baseplate; wherein the optical length of the external cavity can be approximately an order of magnitude greater than the optical length of the gain chip; wherein the Bragg grating occupies a majority of the length of the external cavity; and wherein the Bragg grating is apodized to control the sidemodes of the grating reflection.

Bragg gratings of the present invention are designed with a length to achieve a narrow wavelength reflection spectrum sufficient to support only a single lasing mode to operate within a laser employing the Bragg grating as part of an external cavity in combination with a semiconductor gain element. Lower phase noise/lower linewidth performance of the laser may be achieved when the laser is designed to operate with just one possible single mode over a range of wavelengths on the long wavelength side of the Bragg grating spectrum past the peak reflection wavelength. The further to the long wavelength side of the grating reflection spectrum the laser can operate in a single mode, the larger the slope of the grating reflectivity versus wavelength at the operating wavelength, and the lower the phase noise/linewidth performance of the laser.

The need for a low cost, high manufacturing volume version of the extended Bragg reflector laser of this invention, for use in a mass market application such as in automotive LIDAR systems, may be satisfied through the use of miniaturized, versions of the laser. In various embodiments, the Bragg grating and laser dimensions can be decreased through the use of a high index, ultra-low loss waveguide, e.g. an ultra-low loss silicon waveguide. Silicon waveguides have high optical mode confinement and a refractive index greater than 3, which can be twice the value of low confinement waveguides using silicon nitride, or silica waveguides, so that a 10 mm long silicon Bragg grating can have a similar optical length to a 20 mm long silicon nitride Bragg grating, making an E-DBR laser using a silicon Bragg reflector more compact (and therefore lower manufacturing cost). Using ultra-low loss silicon waveguides additionally provides greater compatibility with CMOS foundry based high volume and low cost manufacturing, achieved from a silicon photonics foundry.

In various embodiments, spiral or other non-straight Bragg grating shapes may be used to reduce the overall device area. It will be appreciated that the non-straight shapes may be used with both higher, e.g., silicon, and lower index materials, e.g. silicon nitride, silica, tantalum pentoxide, etc. Using non-straight Bragg grating shapes may also provide an additional advantage of reducing the effects of index or thickness variations across the wafer that can occur for these deposited materials, which can affect the Bragg grating performance.

In various embodiments, integrated monitoring and feedback control of the lasing mode may be employed. With lasing mode control, the need for the Bragg grating to make up over 75% of the external cavity optical length can be relaxed, so that only approximately 50% of the external cavity optical length need be made up by the Bragg grating. Various embodiments of the present invention may include an amplitude apodization of the DC index in a planar Bragg grating to keep a constant overall DC index within the Bragg grating, to improve sidelobe performance, also including DC index control outside of the written grating to remove or significantly reduce effects of a DC index produced Fabry-Perot cavity.

DETAILED DESCRIPTION OF THE INVENTION

Figure 1:
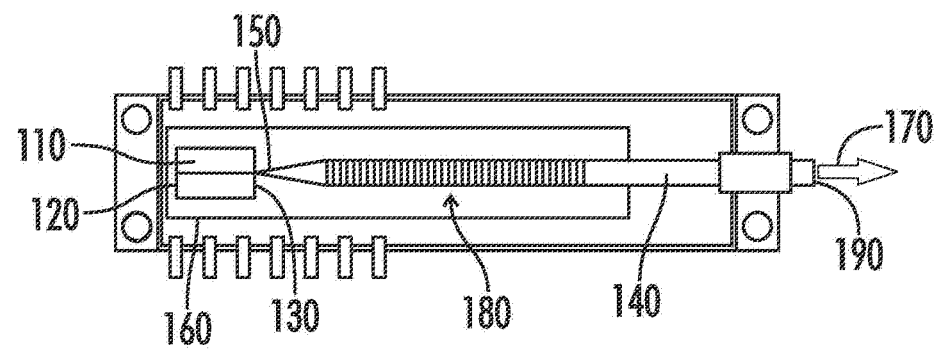
FIG. 1 is a schematic diagram of an ultra-low noise laser design according to embodiments of the present invention.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the exemplified embodiments. Accordingly, the invention expressly should not be limited to such exemplary embodiments illustrating some possible non-limiting combination of features that may exist alone or in other combinations of features; the scope of the invention being defined by the claims appended hereto.

This disclosure describes the best mode or modes of practicing the invention as presently contemplated. This description is not intended to be understood in a limiting sense, but provides an example of the invention presented solely for illustrative purposes by reference to the accompanying drawings to advise one of ordinary skill in the art of the advantages and construction of the invention. In the various views of the drawings, like reference characters designate like or similar parts.

FIG. 1 is a schematic of an ECL/E-DBR laser incorporating a gain chip and external fiber cavity with a fiber Bragg grating (FBG) in the fiber cavity. A TEC under the baseplate on which the gain chip and FBG are placed controls the temperature. As shown in FIG. 1, an external cavity laser according to an embodiment of the present invention includes a semiconductor gain element, or gain chip 110, coupled to an external cavity 140, including an FBG 180 which provides the other end of the laser cavity. The laser radiation 170 is output through the fiber which incorporates the FBG. The gain chip 110 has a high reflectivity (HR) facet 120 forming one end of the laser cavity, and low reflectivity facet 130 to avoid reflections and allow the light within the gain chip to be coupled into an external cavity. The low reflectivity facet can be implemented using an anti-reflection (AR) coating or angled waveguide facet or a combination of AR coating and angled waveguide facet.

Figure 7:
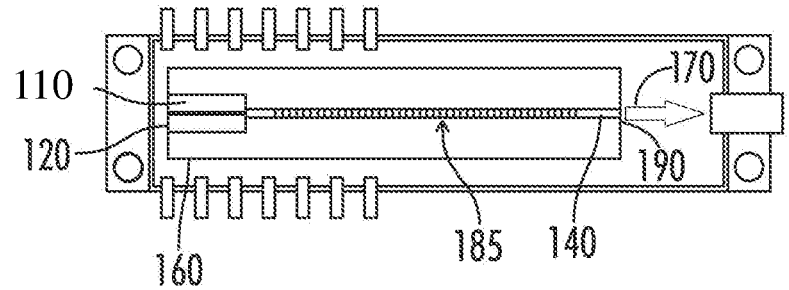
FIGS. 7-9 are schematic diagrams of ultra-low noise laser designs according to embodiments of the present invention.
Figure 8:
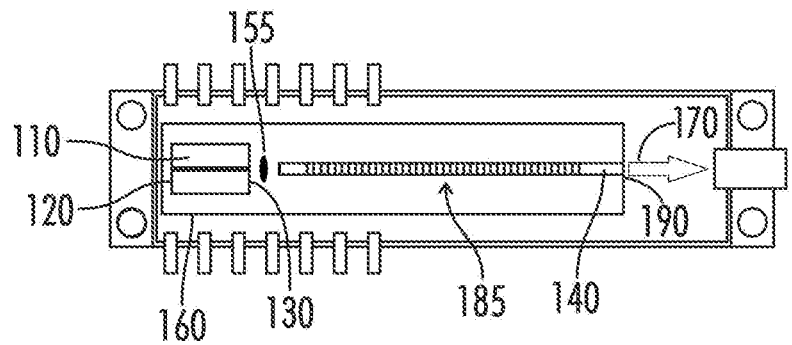
Figure 9:
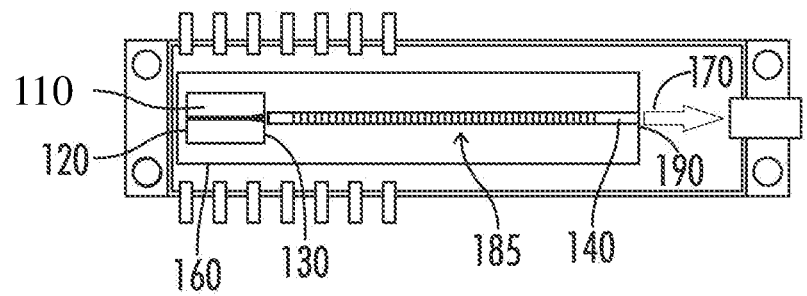

Light is coupled into the external cavity, which can be in an optical fiber, as shown in FIG. 1, or may be in a waveguide (e.g. silica, silicon or silicon nitride waveguide) as shown in FIGS. 7-9, and the end of the fiber can be lensed and AR coated 150 as shown in FIG. 1, or a lens placed between the fiber/waveguide and gain chip as shown in FIG. 8, or the gain chip 110 modified to provide high coupling efficiency directly to the external cavity as shown in FIG. 9. High coupling efficiency between the gain chip and external cavity is required to create a high power laser, requiring some lensing scheme as shown in FIG. 8, or a gain chip with a beam expander as shown in FIG. 9, to obtain coupling efficiencies to the external cavity of at least 60%.

The baseplate or heatsink 160 under the gain chip and FBG is temperature controlled by a thermo-electric cooler (TEC), using temperature feedback from a temperature sensor, e.g. a thermistor placed close to the gain chip. Those skilled in the art understand that 'thermistor' represents many possible devices that can be used to monitor temperature for the purpose of controlling temperature, such as a bi-metal thermal couple, semiconductor diode junction, or negative temperature dependence (NTD) device.

The Bragg grating 180 can be written directly into an optical fiber, as in a fiber Bragg grating (FBG), which can be accomplished with tremendous precision using industrial processes to create FBGs with extremely well controlled reflection properties, such as extremely narrow reflection bandwidth, grating apodization (to control sidelobes), and controlled grating chirp. The FBG is a preferred approach to develop ultra-low noise ECLs, due to the extreme control that can be used in fabricating these devices, leading to an extremely narrow reflection bandwidth with very sharp filter characteristics. Similar gratings 185 are possible in silicon nitride based waveguides, silicon, silica and other low loss waveguides, using ultra-low kappa grating designs, as shown in FIGS. 7-9, which can also be used in these ultra-low noise lasers.

In order to provide a very stable single mode operation device with ultralow linewidth, a long grating or FBG is used in the laser cavity, providing a long cavity length, also providing a very narrow reflection bandwidth. When taken to the extreme, as in this concept, the Bragg grating itself makes up a large portion of the laser cavity, at least 75%, providing excellent mode control and ensuring that only one mode can lase. The bandwidth of the Bragg grating narrows as it is extended in length, countering the effect of the narrower mode spacing from the long laser cavity, while the proportion of the laser cavity within the Bragg grating increases. The concept is to make the grating a sufficiently large part of the overall cavity length to ensure single mode operation for a large part of the operating range of the laser, e.g. for high power gain chip physical lengths in the range of 600 microns to 1 mm or more (equivalent to optical length ~2 mm to 3.5 mm in air), the Bragg grating physical length should be significantly longer, e.g. ≥40 mm (equivalent to optical length ≥60 mm in air), i.e. in this case the Bragg grating is ~20× the optical length of the gain chip, to ensure a large single mode operating range. The grating must start close to the gain chip, i.e. there should be no long region of the external cavity without a grating in it. As the grating is made longer, e.g. 50 mm or 100 mm, the percentage of the overall cavity being part of the grating increases, making the laser single mode operation range even larger. Alternatively, the longer grating can support a longer gain chip (for higher power) or longer gain chip plus laser cavity region without a grating. Increasing the percentage of the laser cavity taken up by the grating, and fabricating a grating with as narrow a bandwidth as possible, creates the condition where for much of the operating range of the laser, i.e. for different cavity phases, the device has only one possible lasing mode and a very stable single mode operation, providing a large single mode operating range.

The optimum design for providing a wide single mode operating region has the fiber lens at the edge of the FBG, or close to it. This can be accomplished practically by lensing the FBG fiber very close to the end of the FBG. The lensed fiber end provides the high coupling efficiency required for high power laser operation. The fiber lens is also AR coated to reduce unwanted optical reflections within the laser cavity, which can increase laser noise and reduce the single mode operation range if significant.

A major issue with using a long grating or FBG in the laser cavity as described above is that the reflection characteristics of the long FBG (or integrated Bragg grating) become more sensitive to variations in the local grating sections along the length of the Bragg grating, especially as the Bragg grating length is increased sufficiently to provide a very narrow bandwidth and also provide a large single mode operating region. The longer the Bragg grating, the narrower its bandwidth, and therefore the more sensitive it is to local variations which may occur from changes in temperature or strain along the length of the Bragg grating.

Variations in temperature along the length of a long FBG are inevitable when one end of the FBG is mechanically and thermally attached close to the gain chip, which itself is a heat source that increases in heat generation as its current bias is increased. For the long FBG lengths envisioned in this novel laser design, e.g. ≥40 mm in length, small variations in temperature, e.g. tenths of a degree, change the reflection peak wavelength along the length of the FBG and therefore broaden its bandwidth; which reduces the single mode operating range of the laser. For this reason, lasers incorporating a Bragg reflector designed by other researchers have limited the length of the Bragg reflector. The following novel concepts according to embodiments of the present invention are proposed in order to overcome this limitation, and allow clean single mode operation over a wide range for much longer FBG lengths, leading to lasers with narrower linewidth.

Figure 2:
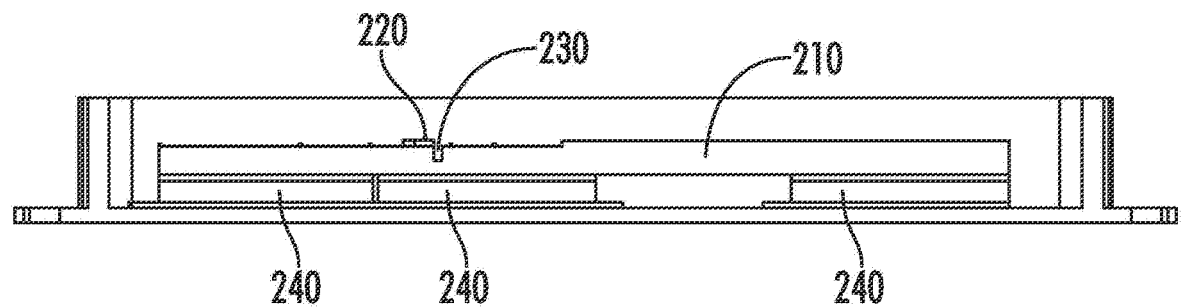
FIG. 2 shows a side view of an ultra-low noise laser design according to an embodiment of the present invention.

The first concept according to an embodiment of the present invention incorporates the FBG and gain chip on the same long thermally conductive baseplate, as shown in FIG. 2. The gain chip on submount 220 is attached to the baseplate 210 next to a narrow trench 230 in the baseplate 210, with the FBG being within a long groove on the right side of the baseplate. One or multiple TECs may be used to control the temperature of the baseplate. The fiber lens is attached close to the trench on the right side. In this concept, at the chosen bias point of the gain chip, there will be a temperature variation along the length of the baseplate related to the heat generated in the gain chip and the conductivity and geometry of the baseplate. The temperature profile along the FBG (provided by the gain chip heating) in one embodiment is optimized through the baseplate geometry (including the trench), so that the temperature reduces linearly versus distance to the right of the trench. The linear temperature variation of the FBG can then be counteracted by a linear wavelength chirp in the FBG, so that the overall effect is an unchirped FBG. More generally, the temperature profile expected along the length of the FBG can be calculated (and measured), and then the FBG can be designed to include a variation in grating pitch along its length (wavelength chirp) that counteracts the temperature profile created by the gain chip. Additionally, more detailed calculations can be made for the temperature variation along the FBG, and the FBG can be written with a more complex wavelength (and/or amplitude) variation along its length, so that at the operating point of the laser (known gain chip bias and temperature profile) the FBG exhibits the designed reflection response, which can be more complex in order to improve the laser performance (amplitude and/or phase/wavelength variations).

Figure 3:
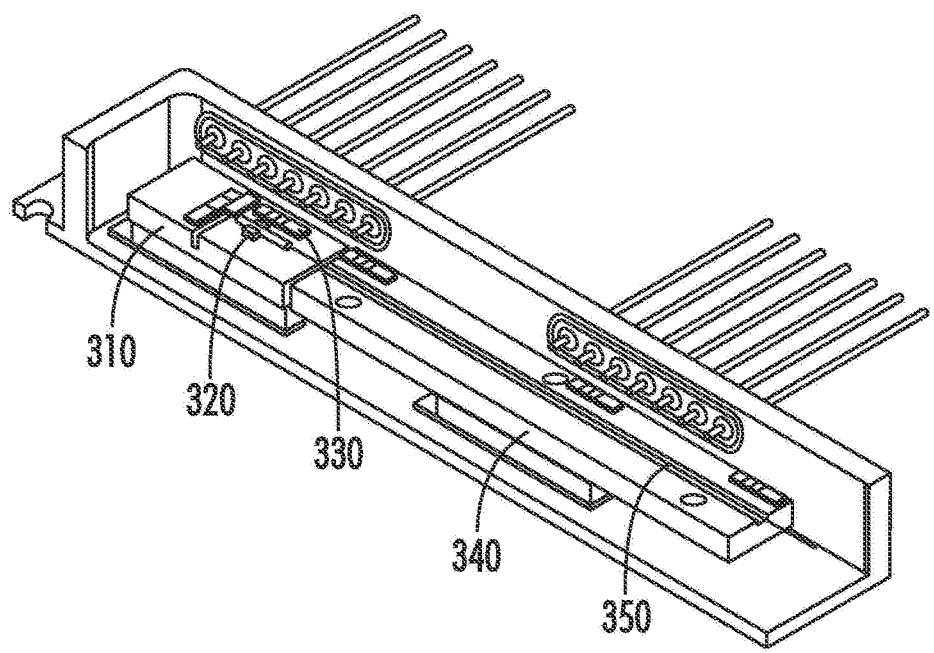
FIG. 3 shows an ultra-low noise laser design according to another embodiment of the present invention.
Figure 10:
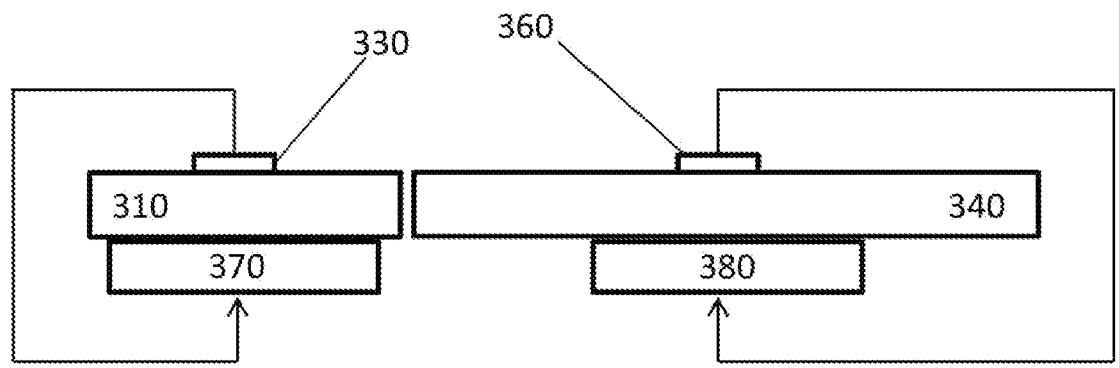
FIG. 10 shows temperature control loop embodiments of the present invention.

The second design concept according to an embodiment of the present invention places the gain chip and FBG on separate baseplates (or heatsinks) 310, 340, as shown in FIG. 3, so that the gain chip baseplate 310 can be kept at one temperature (through the use of a TEC 370 and thermistor 330 within a feedback loop) while the FBG baseplate 340 temperature is controlled separately (with a second TEC 380 and thermistor 360), as shown in FIG. 10. FIG. 3 shows the fiber and fiber attachment within the package. If a high conductivity FBG holder is placed around the FBG, then the temperature along the FBG within this holder 350 can be kept constant, i.e. very small temperature variation, which supports long FBGs with very narrow bandwidths. To obtain high coupling efficiency from the fiber lens to the gain chip, the fiber lens must be held close to the gain chip, e.g. by a welded clip 320 if laser welding is used for packaging the device, on the same baseplate 310 as the gain chip for stability of this alignment. This leads to the temperature of the end of the FBG next to the fiber lens varying with the temperature of the gain chip. In a standard laser package, a thermistor is placed next to the gain chip with a feedback loop used to keep this measured temperature constant, e.g. at 25° C. In one embodiment of the present invention, the thermistor 330 is placed next to the welding clip 320, or fiber holding structure, that holds the lensed end of the FBG, with the feedback loop used to keep this temperature constant (rather than that of the gain chip). With this end of the FBG held at a constant temperature, the rest of the FBG (on its separate baseplate 340) is also set to the same temperature, in this case the entire length of the FBG is held at the same constant temperature. Using this two baseplate approach, with the temperature at the lensed FBG end being fixed on one baseplate kept at the same temperature as the long FBG enclosed in the FBG holder, the entire length of the FBG is held at the same temperature, while also the FBG makes up almost all of the cavity other than the gain chip itself, leading to a large single mode operating range and a very narrow linewidth laser. This approach can support very long FBG lengths, e.g. up to 100 mm and longer.

Figure 4:
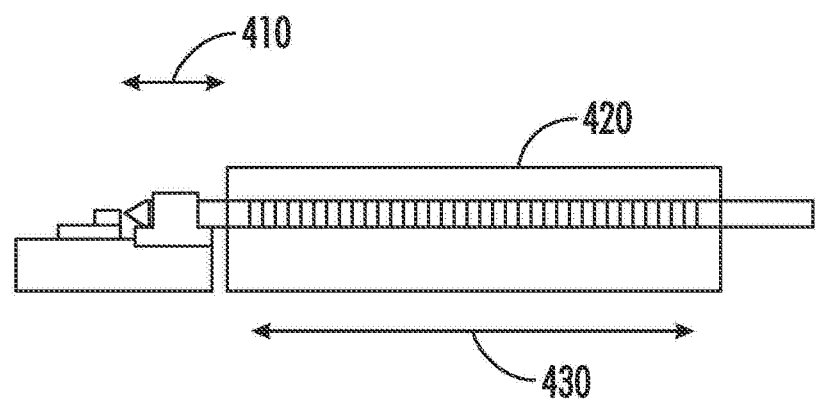
FIG. 4 shows an ultra-low noise laser design according to another embodiment of the present invention.

Using the two separate baseplates as described above, and extending the length of the FBG≥40 mm, the laser can be provided a good single mode operating range even as a short section of the fiber cavity between the fiber lens and the start of the grating is made up of fiber without a grating. This short section of fiber without a grating can be extended until the laser single mode range becomes too limited; the longer the FBG, the longer the non-grating fiber section can be made. By increasing the FBG length, the non-grating fiber length 410 can be extended until it covers the distance from the attached fiber lens end, across to the second baseplate, and into the FBG holder 420 as shown in FIG. 4. This can be accomplished with a mechanical/thermal design that places the holding structure for the FBG lensed end as close as possible to the controlled temperature region of the FBG holder on the second baseplate. When the FBG 430 is entirely enclosed within the FBG holder 420, which is temperature controlled and has a high thermal conductivity, e.g. made of Copper-Tungsten or Aluminum Nitride, the temperature of the FBG can be tuned and the complete FBG will be kept at the same temperature. This provides a way to tune the wavelength of the laser, while keeping the excellent narrow linewidth properties of this laser. This approach works better as the length of the FBG is increased (keeping the non-grating section of the fiber a fixed length), so that longer FBG devices with narrower inherent linewidth can more easily be made tunable in operating wavelength. The temperature of the FBG can be tuned over a very wide temperature range, e.g. 0° C. to 80° C., to provide tunability of the laser wavelength; the wavelength tunability being set by the change in index versus temperature of the FBG. Conversely, using a similar design with the FBG entirely enclosed within a highly thermally conductive holder, keeping the temperature constant along its length, the FBG temperature can be left to float with the temperature of the laser package, i.e. with no TEC or control loop, the device providing the required excellent performance characteristics with the wavelength changing to follow the temperature of the FBG. In this embodiment, no TEC or thermal control loop is required for the FBG, reducing both the cost of the approach and also the power dissipation of the module, with the FBG being operated 'uncooled'. While the above description relative to FIGS. 1-4 was directed to FBG laser embodiments, these concepts are generally applicable to the various other Bragg grating laser embodiments described herein, such as separate gain element and planar waveguides, and semiconductor gain elements that are integrated with the waveguide either monolithically or as a discrete component.

Figure 5:
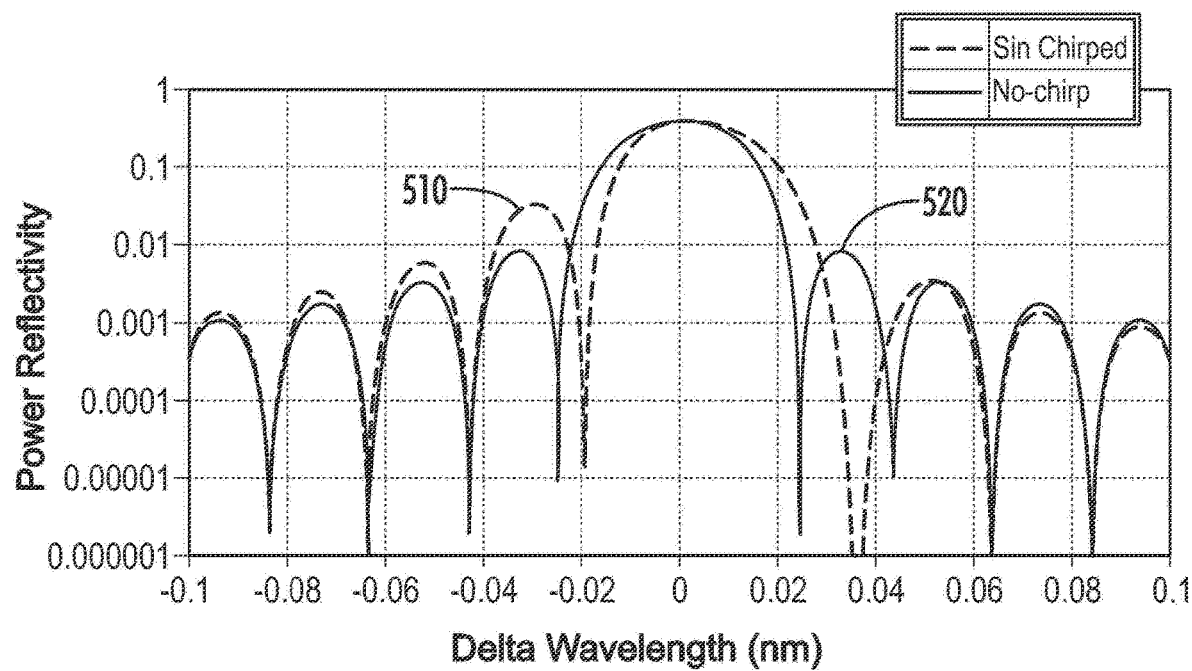
FIG. 5 shows a power reflection spectrum of a 40 mm fiber Bragg grating (FBG) with Gaussian amplitude apodization, and a power reflection spectrum of a Gaussian amplitude apodized 40 mm FBG with added sinusoidal chirp according to an embodiment of the present invention.

In order to extend the single mode operating range of the laser, the effect of sidemodes of the Bragg grating need to be considered. The reflection spectrum of a uniform 40 mm FBG provides the narrowest bandwidth for this grating length, however, the sidemodes are large and affect the single mode operation range of the laser, as well as its noise performance. The closest sidemode on the long wavelength side of the grating is close to the lasing wavelength, especially when the lasing mode is positioned on the long wavelength side of the grating reflection spectrum in order to reduce the laser linewidth. To extend the single mode operating range of the laser, the sidemodes of the grating reflection must be reduced. One way to accomplish this is to apodize the grating, i.e. to vary the reflectivity spectrum along the grating with e.g. a Gaussian profile. The power reflectivity spectrum 520 of a 40 mm FBG that is apodized using a Gaussian amplitude profile is shown in FIG. 5. The grating can also be apodized in its phase, or wavelength, to provide a chirp of the wavelength along the grating, as was used in an embodiment discussed above to counteract the temperature variation along the grating.

A concept according to embodiments of the present invention is to modify the shape of the Bragg grating apodization to eliminate, or reduce the size of, the first sidemode on the long wavelength side of the grating reflection spectrum. This is achieved by applying a sinusoidal chirp to the grating, the effect of which is to eliminate/reduce the first long wavelength sidemode, while at the same time the short wavelength sidemode is increased in size. The reflection spectrum 510 for this design, a 40 mm FBG with Gaussian amplitude profile plus the added sinusoidal chirp is also shown in FIG. 5. The elimination/reduction of the first long wavelength sidemode allows the lasing mode to more easily move to longer wavelength without interaction with this close-in mode, and also reduces the relative intensity noise (RIN) that occurs as an interaction between the lasing mode and this first long wavelength sidemode.

In order to control the position of the lasing mode relative to the Bragg grating reflection spectrum, placing it at the optimum position for single mode stability and optimum noise performance (narrow linewidth and low RIN), i.e. on the long wavelength side of the reflection peak, it would be useful to have a feedback control loop to measure some aspects of the laser operation and use that information to control the mode position. This feedback loop would provide continuous single mode laser operation over the life of the laser. An alternative approach is to set the laser at the correct operating mode position at the start of its operating life, with the laser design and component reliability optimized to prevent significant movement of the lasing mode from the correct position on the Bragg grating reflection spectrum over the life of the component.

Figure 11:
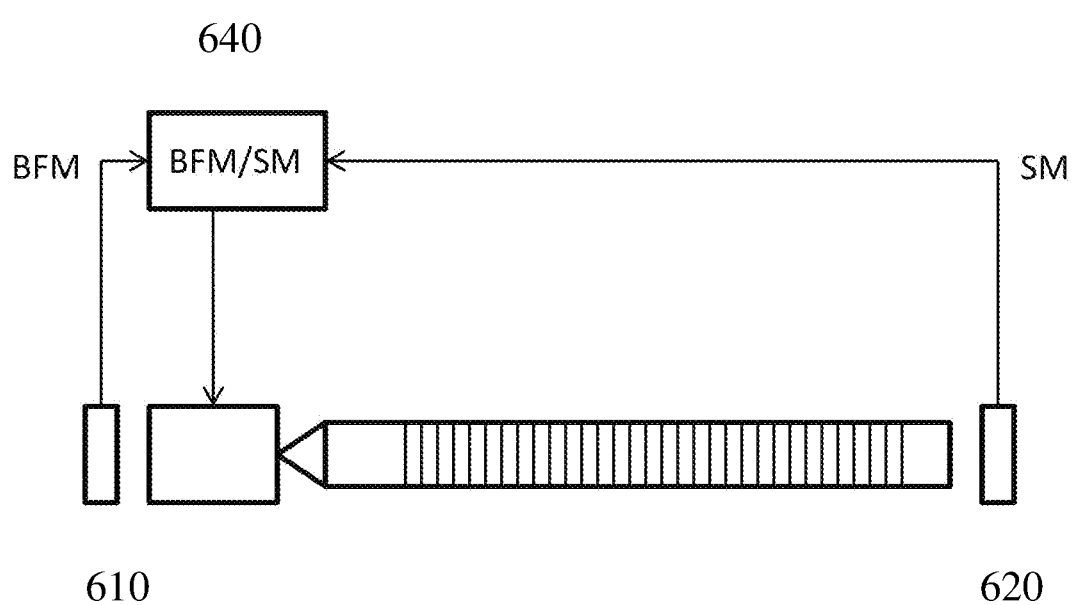
FIG. 11 shows laser locking embodiments of the present invention.
Figure 12A:
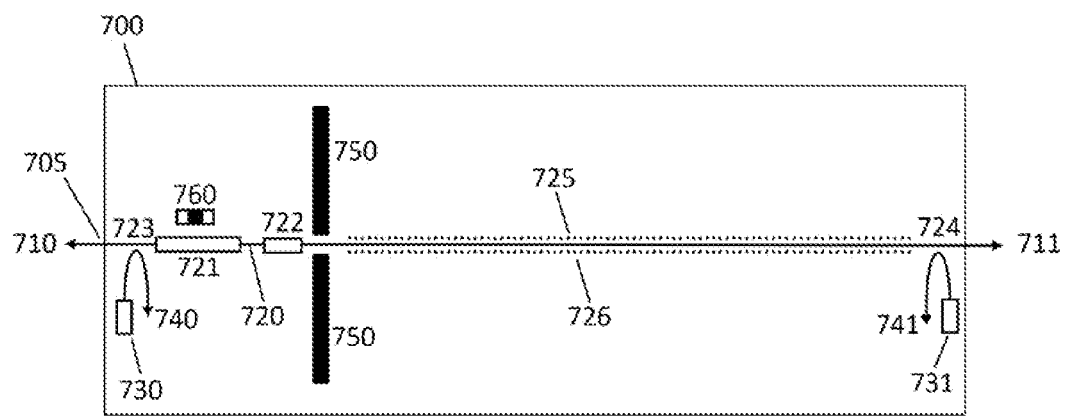
FIGS. 12A-12C show planar embodiments of the present invention.
Figure 13:
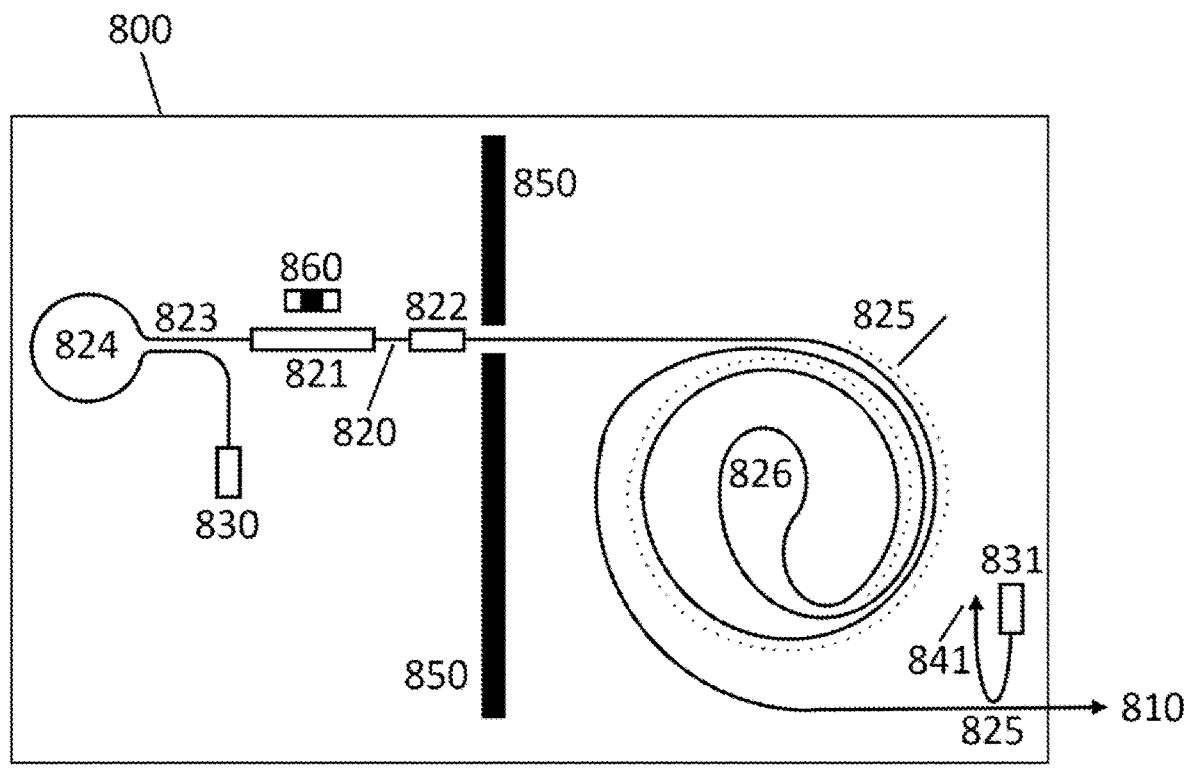
FIG. 13 shows a planar embodiment of the present invention including a spiral shaped Bragg reflector.

The very narrow optical filter of the Bragg grating and the novel laser cavity design ensure that only one mode can lase, and if that mode is locked to a specific position on the Bragg grating reflection spectrum, through an electronic feedback loop, then the laser will always stay in that same single mode over the life of the component. The feedback mechanism according to an embodiment of the present invention uses the optical output power of the laser, which has passed through the Bragg grating (a narrow filter), as well as the back facet monitor (BFM) current that measures the light from the gain chip HR facet (no filter) at the other end of the laser as shown in FIGS. 11, 12A, and 13. Taking the ratio of the BFM value to the output power provides a signal on which to lock the laser; a fixed value for this ratio will set the laser at a specific position on the Bragg grating reflection spectrum. Comparing the BFM and output power signals allows the elimination of laser intensity variations from the feedback signal, as intensity variations are in both signals.

Figure 6:
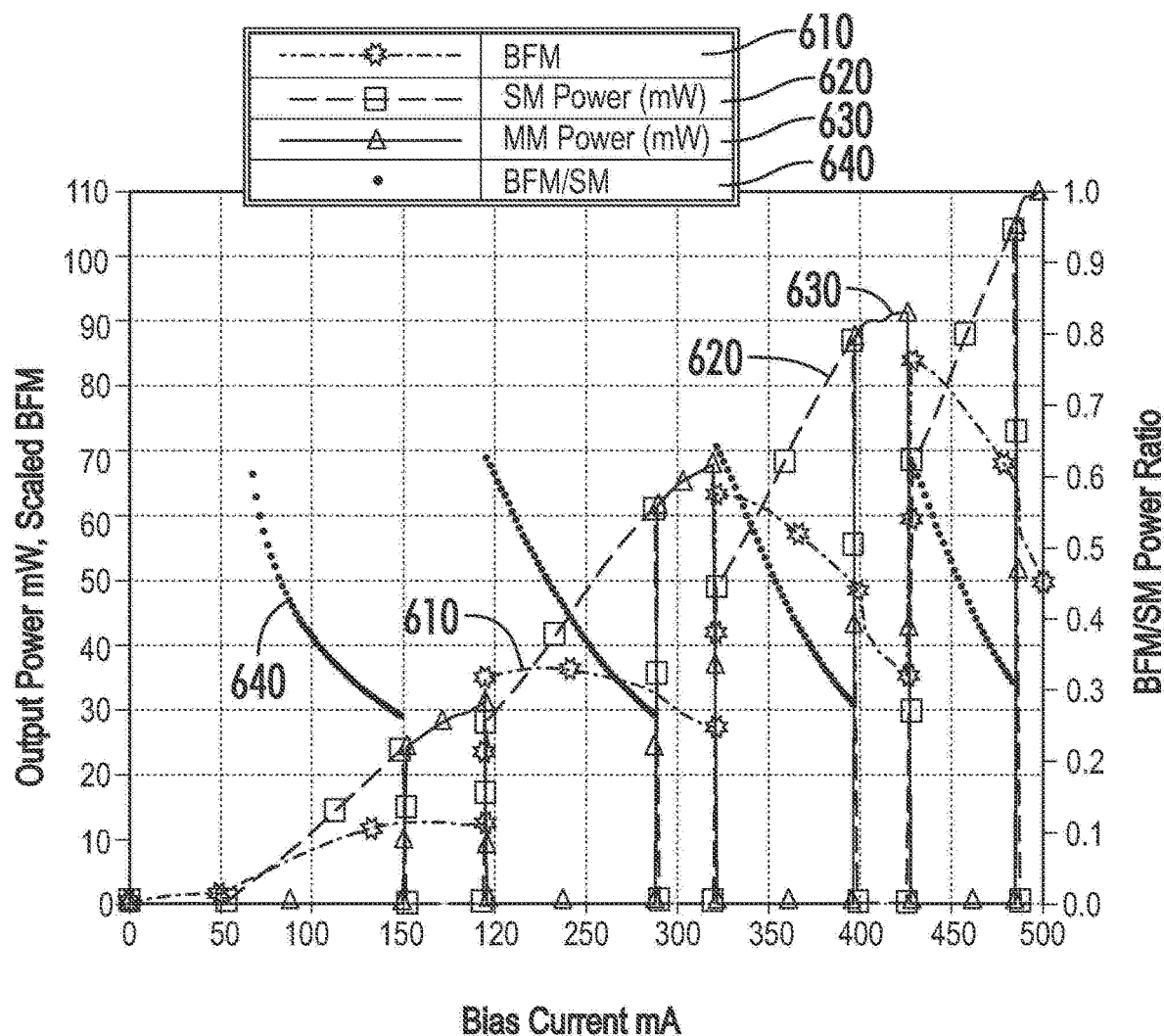
FIG. 6 shows measured characteristics of an ultra-low noise laser according to an embodiment of the present invention.

An example of the measured single mode power (SM) 620, the multimode power (MM) 630, the BFM output 610 and the ratio of BFM/SM 640 are shown in FIG. 6 as the current is varied to the gain chip in one of the ultra-low noise lasers according to an embodiment of the present invention. The SM and MM 620, 630 curves show the light versus current characteristics for the external cavity laser, the increased heat in the gain chip as the current is increased changing the cavity phase and moving the laser through a single mode operating region to a multimode region and then to another single mode operating region as the phase continues to change. The value of BFM/SM 640 in FIG. 6 clearly shows that this ratio is replicated for each single mode regime of the laser, and that by choosing the appropriate ratio for BFM/SM the laser can be locked to a specific part of the reflection spectrum, such as choosing a position on the long wavelength side of the reflection spectrum, e.g. a BFM/SM ratio of 0.4.

Locking the laser to a specific value of BFM/SM using a fast feedback loop, which uses the large slope of the reflection spectrum on the long wavelength side of the Bragg grating as a frequency discriminator to convert laser output frequency changes to amplitude changes, will also reduce the frequency noise of the laser at frequencies within the feedback loop bandwidth. Reducing the low frequency phase/frequency noise of the laser is important for a number of sensing applications, and in coherent mixing applications.

Note that in FIG. 1 the laser output 170 is shown to be taken from an output surface 190 of the external cavity according to an embodiment. In another embodiment of the laser shown in FIG. 1, the output power can be taken from the first end/high reflectivity facet 120 of the gain chip 110, rather than the fiber 140 which incorporates the FBG 180.

Figure 12B:
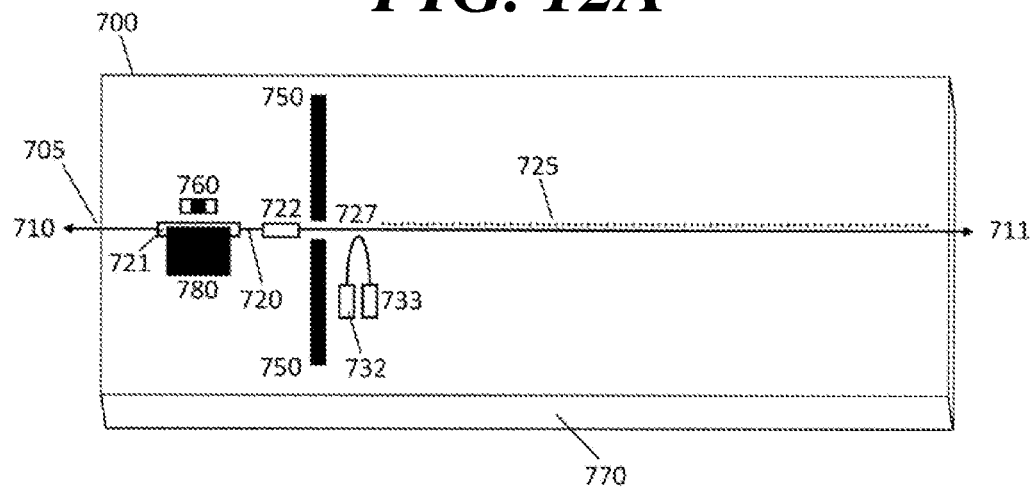
Figure 12C:
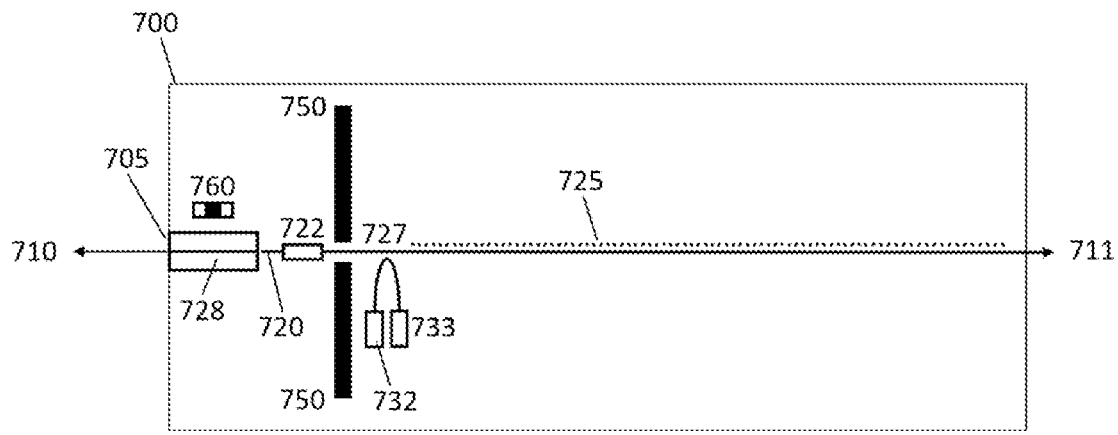

FIGS. 12A-12C show planar embodiments of the laser 700 with a waveguide 720 extending along the length of the device, outputs of the device, 710 and 711, shown at the high reflectivity (HR) facet 705 (710) and the output through the Bragg grating 725/726 (711). The semiconductor gain element 721/728 provides optical gain within the laser cavity, its temperature being monitored by temperature sensor 760. While FIGS. 12A-12C show integrated planar embodiments, it will be appreciated that the gain element may not be integrated with, but coupled to, the waveguide.

The embodiments shown in FIGS. 11-12A-12C may include a cavity phase control element 722 to change the optical phase within the cavity to control the lasing mode position on the Bragg grating and to improve single mode operation and stability. The cavity phase control element 722 may be one or more heaters positioned close to the waveguide to vary the temperature and hence the refractive index of the waveguide and the optical phase of the light within the laser cavity. Alternative phase control elements could use electro-optic or other tuning mechanisms with or without temperature control.

The Bragg grating in FIG. 12A includes periodic perturbations both above the waveguide 725 and below the waveguide 726, while the Bragg gratings in FIGS. 12B and 12C includes perturbations only above the waveguide 725. Either option of Bragg grating can provide the required reflector performance.

FIG. 12C depicts a discrete semiconductor gain element 728 integrated in and coupled to the planar waveguide 725 rather than a monolithically integrated semiconductor gain element 721. The grating configurations of either FIG. 12A or FIG. 12B may be employed in hybrid integrated planar embodiments of FIG. 12C.

The embodiments depicted in FIG. 12A includes two 2×2 directional couplers, 723 and 724, which couple a small portion of the light from the main laser waveguide 720. Light within the laser cavity going towards the HR facet 705 is coupled into monitor photodetector 730. The other output of directional coupler 723, which contains light reflected back from the HR facet 705, is absorbed in a reflection-less attenuator 740, to avoid unwanted reflections within the laser cavity. The reflection-less attenuator can be a waveguide spiral in which the waveguide width is constantly reduced so that the optical mode eventually leaves the waveguide into the substrate, effectively absorbing the light while providing no optical reflection. The monitor photodetector 730 acts like the BFM in FIG. 11. At the other end of the laser cavity, following the Bragg grating, light is coupled by directional coupler 724 into monitor photodetector 731, which monitors the output light of the laser following the Bragg grating. A portion of any light that returns back to the laser, from reflections of its output 711, is coupled to a reflection-less attenuator 741.

The embodiments depicted in FIG. 12B replace the two monitor photodiodes at the two ends of the laser cavity of FIG. 12A with a single 2×2 directional coupler 727 and two monitor photodiodes 732 and 733. The measured signals on monitor photodiodes 732 and 733 can be used to generate a feedback signal to control the lasing mode with respect to the Bragg grating reflection in a similar way to the BFM/output power monitors do in FIG. 11. Monitor photodiode 733 measured the laser light out of the gain element, which is proportional to the power on the HR facet, i.e. proportional to the BFM measurement. Monitor photodiode 732 measures the reflection off the Bragg grating, therefore including the filter effect of the Bragg grating in its measurement, i.e. similar to the power measured following the Bragg grating in FIG. 12A, however, with an inverse response relative to the grating (as the grating reflection is equal to 1 minus the grating transmission).

Integrated planar embodiments in FIG. 12A-12C may be fabricated on a single semiconductor substrate 770, such as silicon, indium phosphide, or gallium arsenide, or other substrate material with the semiconductor gain element either monolithically integrated (FIGS. 12A-B) or a separate component that is discretely integrated (FIG. 12C). The embodiments may include elements to improve the thermal performance of the planar waveguide lasers, such as including thermal isolation elements 750, which can be deeply etched trenches, which thermally separate the heat generating gain element and phase control element from the temperature sensitive Bragg grating.

Additionally, FIG. 12B shows various planar embodiments that may include a thermal conduction element 780, which effectively conducts heat generated in the gain element to the conductive substrate 770. The thermal conduction element 780 may be a thick metal layer e.g. gold, with a high thermal conductivity that conducts heat generated in the gain element away through to the substrate material. It may be desirable to remove thermal isolating layers that exist in the device structure in order to improve the heat transfer. As one example, in a silicon on insulator (SOI) device fabricated on the silicon photonics platform, a thermally isolating silica layer may be provided below the silicon waveguide layer that decreases the thermal conductivity of the path from the gain element to the substrate. The silica layer may be removed in areas where it is not required, allowing a highly conductive metal layer to connect from the gain element to the substrate.

Various fiber and planar waveguide embodiments may include Bragg gratings that are not physically linear, i.e., straight, in order to reduce the form factor of the laser. For example, FIG. 13 shows an alternative embodiment of a planar waveguide ECL/E-DBR laser 800. In this embodiment, the optical waveguide 820 running along the length of the laser includes a spiral Bragg grating 825 with perturbations on one side of the waveguide. The spiral reduces the length of the laser, which may also serve to reduce the effects of variations in waveguide thickness and index that can occur across a wafer. Following the spiral Bragg grating, the waveguide is turned back upon itself 826, then the waveguide is spiraled back out leading to the laser output 810. The laser output 810 can be from an output facet of the monolithic laser, in which case the reflectivity of the output facet may be reduced through an antireflection (AR) coating, and/or angled waveguide. Alternatively, when the laser forms part of a larger monolithic photonic integrated circuit (PIC), the output 810 would be a continuation of the optical waveguide 820 into the following integrated photonic component.

The temperature of the gain element 821 may be monitored with a temperature sensor 860, which could be a thermistor or other temperature sensitive element. The laser cavity may also include phase control element 822, to control lasing mode position upon the Bragg grating response. In these embodiments, the HR facet which provides the high reflectivity at that end of the monolithic laser may be replaced by a loop mirror, composed of a 2×2 directional coupler 823 and a waveguide loop 824. The loop mirror may be designed to be highly reflective at the operating wavelength of the laser, allowing a small amount of light to pass through the other port of the directional coupler to monitor photodiode 830. This monitor photodiode provides an output proportional to the light at the HR facet, i.e. equivalent to the BFM. In this embodiment, part of the laser light after the Bragg grating is coupled via 2×2 directional coupler 825 into the output monitor photodiode 831. Light passing through the directional coupler in the opposite direction passes into the reflection-less attenuator 841. The embodiments depicted in FIG. 13 may include thermal isolating elements 850 to isolate the heat generating elements from the temperature sensitive Bragg grating 825.

Figure 14A:
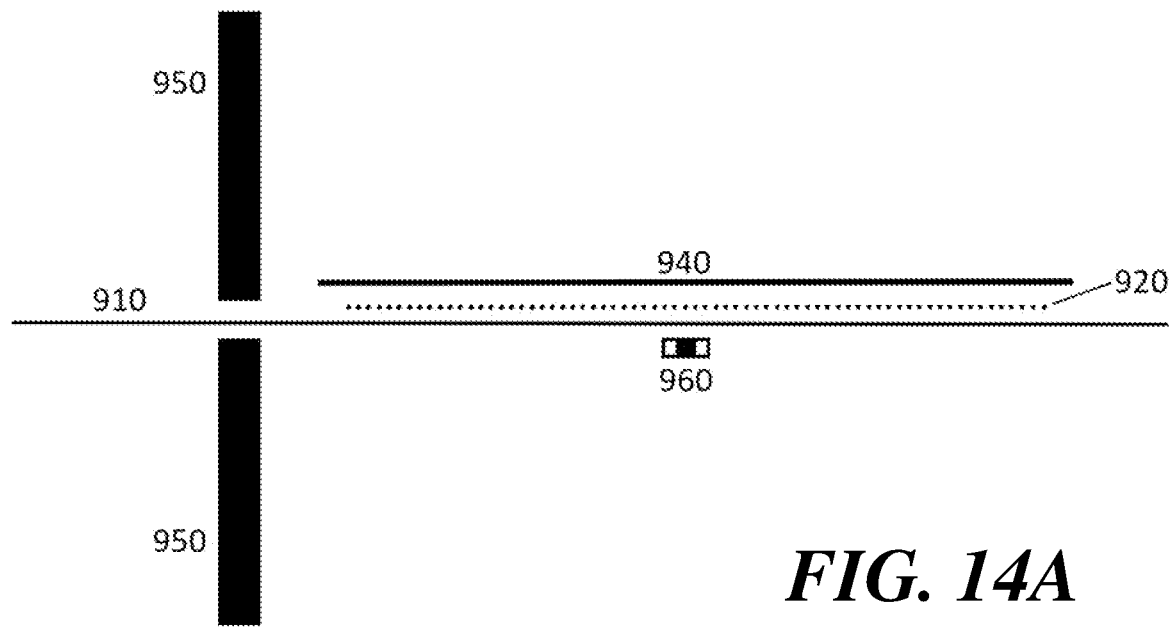
FIGS. 14A and 14B show temperature controlled Bragg reflector embodiments of the present invention.
Figure 14B:
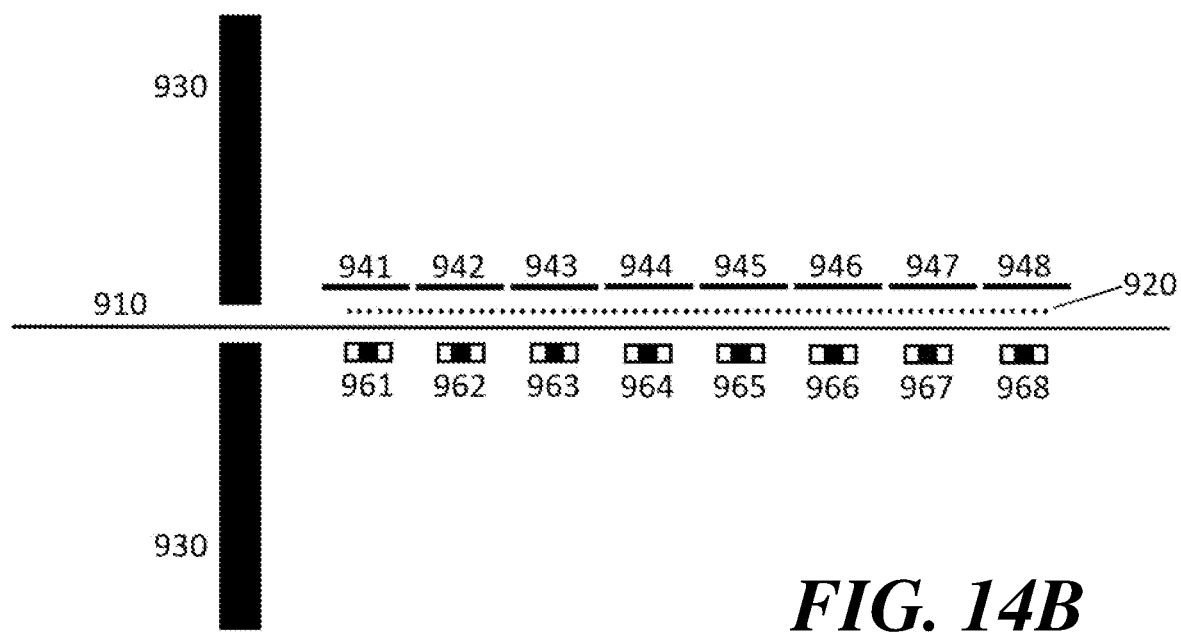

FIGS. 14A-14B show planar waveguide embodiments with a Bragg grating 920 formed from perturbations next to an optical waveguide 910, that include heaters and temperature sensors in order to control the temperature along the Bragg grating. The Bragg grating may be maintained at a uniform temperature or according to a desired temperature profile as discussed relative to FIGS. 1-4. For example, FIGS. 14A-14B embodiments include thermal isolating elements 950, which isolate heat generating elements from the temperature sensitive Bragg grating 920. In FIG. 14A embodiments depict a single heater 940 that may be placed along the length of the Bragg grating 920 to maintain a uniform temperature along the length of the Bragg grating. Changing the temperature along the length of the Bragg grating will also change the center wavelength of the Bragg grating by changing its refractive index, changing the lasing wavelength, and so varying this heating element can be used to tune the wavelength of the laser. A temperature sensor 960 may be placed close to the Bragg grating 920 in order to measure the temperature of the grating. A feedback loop may be used to control the temperature of the grating by using the temperature sensor to measure that temperature, and the heater to change the temperature.

FIG. 14B embodiments depict a series of shorter heaters 941, 942, 943, 944, 945, 946, 947, 948 and associated temperature sensors 961, 962, 963, 964, 965, 966, 967, 968 that may be provided. The multiple heater elements allow the temperature along the Bragg grating to be controlled to provide a specific variation in temperature along the grating, or in the case where heating from the gain element causes a temperature variation along the Bragg grating, the multiple heater elements and associated temperature sensors may be used with feedback loops to eliminate this temperature variation along the length of the grating. In addition to creating a constant temperature along the length of the Bragg grating, the multiple heater elements and associated temperature sensors may be used to vary that temperature in order to control the temperature of the grating and therefore tune the wavelength of the laser.

Figure 15:
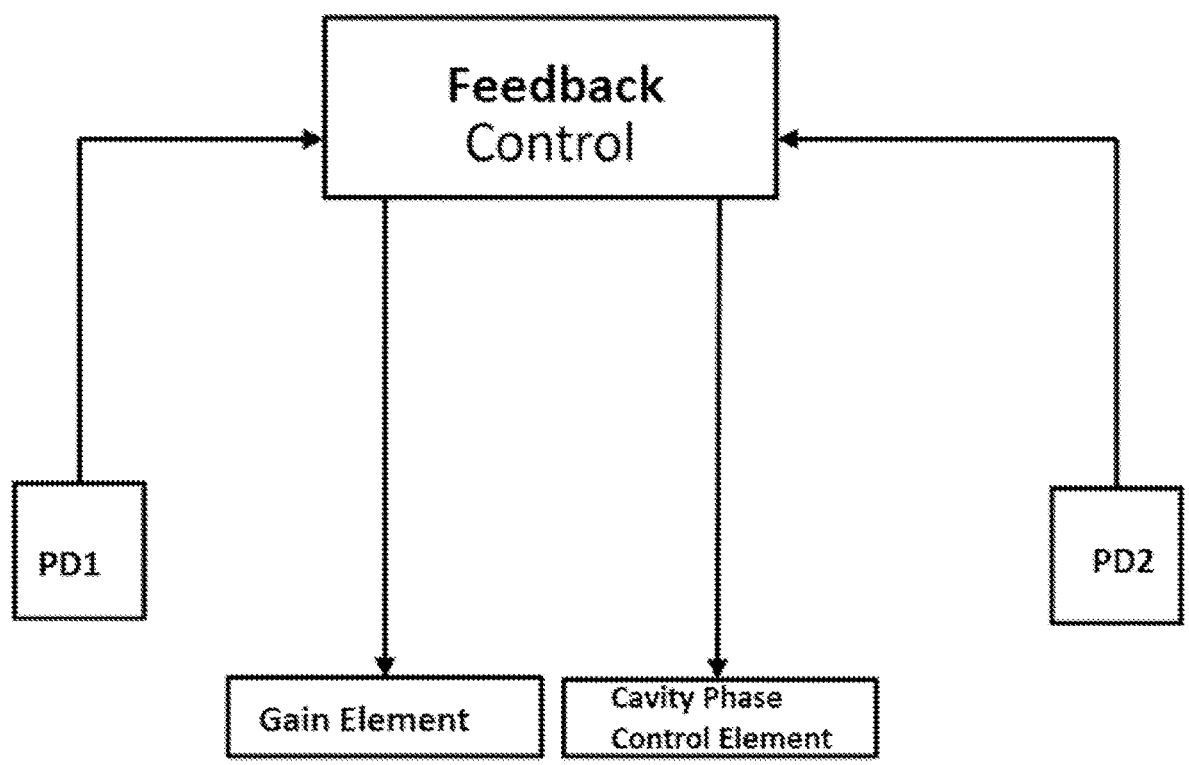
FIG. 15 shows laser locking embodiments of the present invention.

A schematic feedback loop to control the lasing mode position on the Bragg grating reflection spectrum and maintain a stable single mode operation and locked to a specific wavelength within that grating reflection spectrum, is shown in FIG. 15. Like FIG. 11 embodiments, the feedback loop may employ measurements from both directions in the laser cavity to control the gain element and/or cavity phase control element. For example, back facet and output photodetector monitors 730/830 and 731/831 may be used with monolithic lasers as in FIG. 12A and integrated lasers as in FIG. 13, and photodetector monitors 732 and 733 may be within the monolithic lasers as in FIG. 12B to measure power within the laser cavity. The two photodetector monitors provide information that can be used to control the gain element bias current, and the cavity phase control element. As an example, the lasing mode position may be controlled by measuring the ratio of BFM 730 divided by output monitor 731 and keeping that constant by changing the gain element bias current 721 and/or modifying the cavity phase through cavity phase control element 722.

The introduction of the cavity phase control element and feedback loop into discrete and integrated gain element and planar and fiber waveguide embodiments provide improved control of the lasing mode position on the Bragg grating, increasing the single mode stability and reducing the opportunity for the device to change its lasing mode position which can introduce additional noise or make the laser operate with multiple modes. With this improved lasing mode control, the need for the Bragg grating to make up over 75% of the external cavity optical length can be relaxed, so that only approximately 50% of the external cavity optical length need be made up by the Bragg grating.

Figure 16:
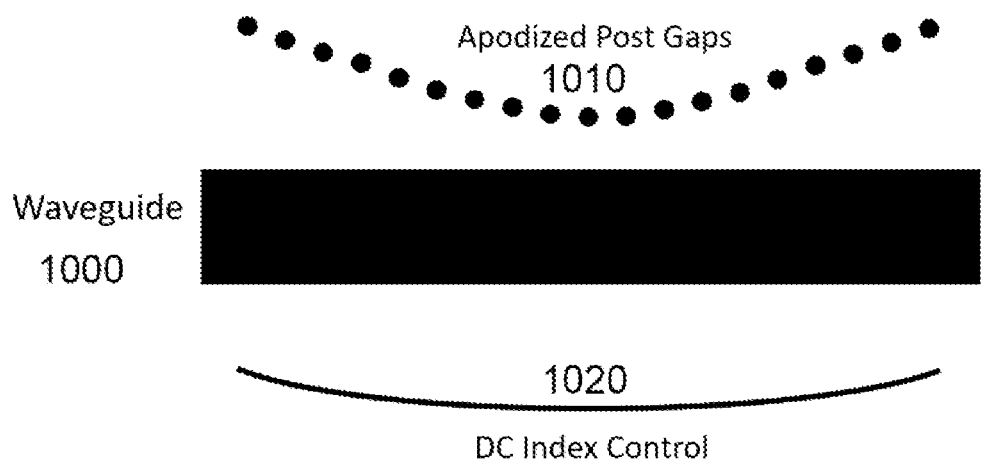
FIG. 16 shows an embodiment of DC index control in a planar waveguide Bragg grating.

FIG. 16 shows an embodiment of the present invention for creating an ultralow coupling coefficient (Kappa) planar Bragg grating, with the amplitude apodized Bragg grating 1010 plus a DC index control element 1020 in order to provide a constant DC index throughout the length of the grating. In this embodiment a series of posts provide the perturbations to create the Bragg grating, the gap between the waveguide and posts chosen to provide the required Gaussian amplitude apodization, e.g. the ultralow coupling coefficient (Kappa) planar Bragg grating could be a silicon nitride waveguide and silicon nitride posts. Additionally, a DC index control element 1020, e.g. a thin line of silicon nitride, is designed to be a varying distance away from the waveguide along the length of the Bragg grating in order to keep the overall DC index along the grating constant.

Figure 17:
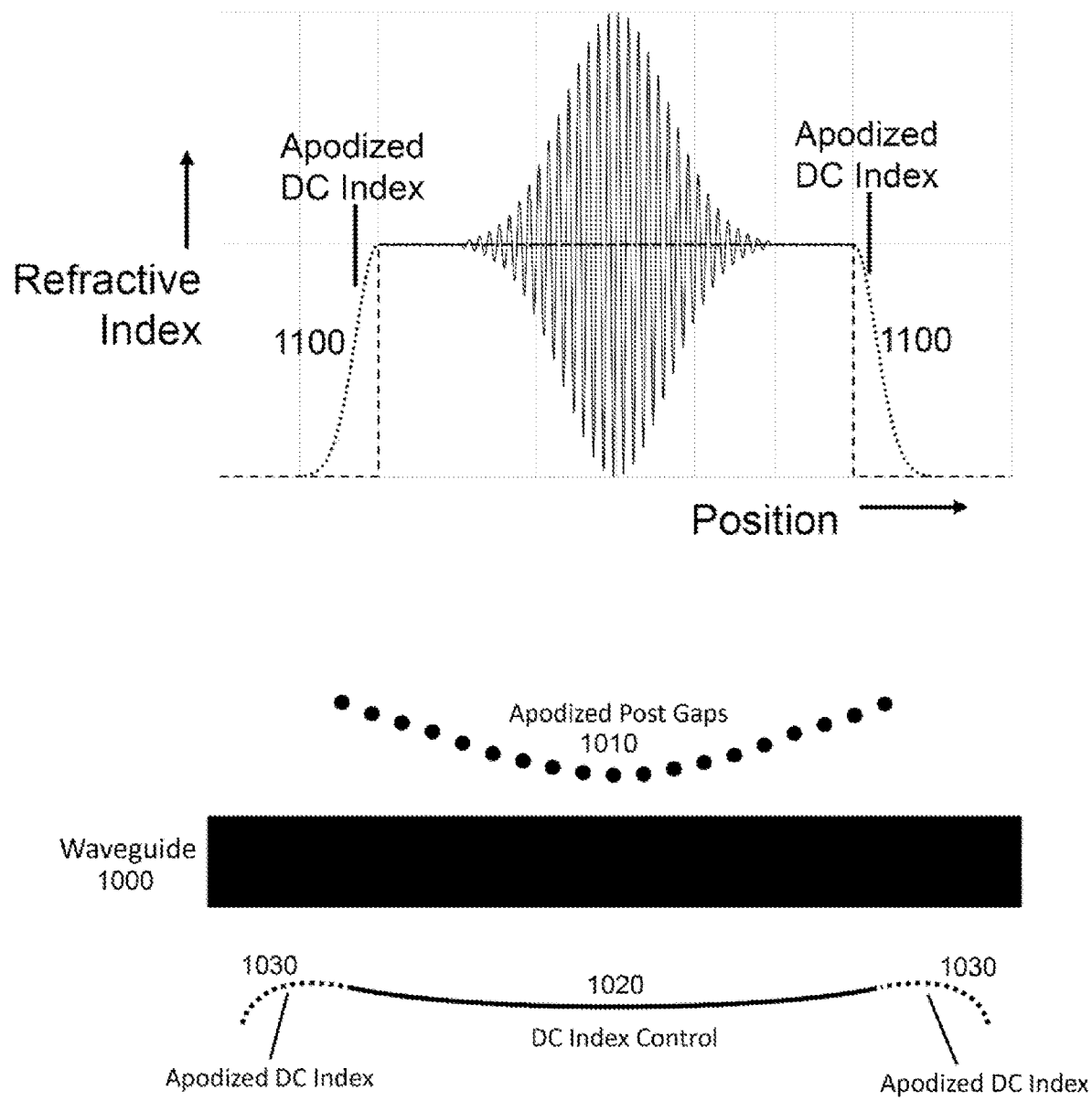
FIG. 17 shows a further embodiment of DC index control in a planar waveguide Bragg grating.

FIG. 17 shows a further embodiment of the invention related to controlling the DC index along the length of an ultralow coupling coefficient (Kappa) planar Bragg grating. In a typical amplitude apodized FBG, e.g. a Gaussian amplitude apodized FBG, the DC index is controlled so that it is constant throughout the length of the Bragg grating. However, at the two ends, the DC index has a step change from the DC index of the fiber up to a higher value along the length of the grating. These twostep changes of the DC index provide a very small reflectivity Fabry-Perot cavity. This extremely small reflectivity Fabry-Perot cavity is likely not an issue in most applications, however, when it is part of an ultralow noise laser, this Fabry-Perot cavity can cause noise peaking at frequencies associated with the free spectral range (FSR) of the Fabry-Perot cavity and its harmonics. As a further embodiment of this invention, the DC index in the planar Bragg grating is itself apodized by adding sections of the DC index control element 1020 that extend beyond the length of the grating and are used to create an amplitude apodization of the DC index so as to reduce or eliminate this potential very low reflectivity Fabry-Perot cavity. FIG. 17 includes an amplitude apodized grating 1010, together with a DC index control element 1020 to keep the DC index constant along the length of the grating, plus additional DC index control sections 1030 extending beyond the length of the grating in order to provide an apodized DC index 1100, e.g. Gaussian variations in the DC index from the value in the grating down to the value in the surrounding waveguide.

REFERENCES

Ref [1]: C. H. Henry, 'Theory of the Phase Noise and power Spectrum of a Single Mode Injection Laser', IEEE J. Quant. Elec. QE-19, p 1391 (1983).

Ref [2]: C. H. Henry, 'Phase Noise in Semiconductor Lasers', IEEE J. Lightwave Tech., LT-4, p 298 (1986).

Ref [3]: R. F. Kazarinov, C. H. Henry, 'The Relation of Line Narrowing and Chirp Reduction Resulting from the Coupling of a Semiconductor Laser to a Passive Resonator', IEEE J. Quant. Elec. QE-23, p 1391 (1983).

Ref [4]: K. Vahala, A. Yariv, 'Detuned loading in coupled cavity semiconductor lasers-Effect on quantum noise and dynamics', Appl. Phys. Lett., 45, p 501 (1984).

Ref [5]: A. Yariv, R. Nabiev, K. Vahala, 'Self-quenching of fundamental phase and amplitude noise in semiconductor lasers with dispersive loss', Optics Letters, 15, p 1359 (1990).

While the present invention has been described at some length and with some particularity with respect to the several described embodiments, it is not intended that it should be limited to any such particulars or embodiments or any particular embodiment, but it is to be construed with references to the appended claims so as to provide the broadest possible interpretation of such claims in view of the prior art and, therefore, to effectively encompass the intended scope of the invention. Furthermore, the foregoing describes the invention in terms of embodiments foreseen by the inventor for which an enabling description was available, notwithstanding that insubstantial modifications of the invention, not presently foreseen, may nonetheless represent equivalents thereto.

What is claimed is:

1. A laser comprising:
   a semiconductor gain element to generate light in response to a bias current and having
   a first end with a high reflectivity forming a first end of a laser cavity and a second end with a lower reflectivity to allow at least a portion of light to pass through the second end; and a waveguide coupled to the second end of the semiconductor gain element to form an external cavity having an optical length and a cavity phase, the waveguide including:

a Bragg grating forming a second end of the laser cavity having an optical length, and a DC index control structure positioned to vary the DC index along at least a portion of the Bragg grating, wherein a distance between the DC index control structure and the waveguide varies over a length of the Bragg grating.

2. The laser of claim 1, wherein the DC index control structure provides for a constant DC index along the Bragg grating.

3. The laser of claim 1, wherein:

the Bragg grating has a reflection spectrum with a long wavelength side, the optical length of the laser cavity and reflection spectrum of the Bragg grating supporting only a single lasing mode, and wherein at least one of the bias current and the cavity phase is controlled to position the single lasing mode on the long wavelength side of the reflection spectrum.

4. The laser of claim 1, wherein the Bragg grating is apodized to control reflection sidemodes.

5. The laser of claim 1, wherein:

the DC index control structure is positioned to reduce reflections from a Fabry-Perot cavity formed between the Bragg grating and the waveguide.

6. The laser of claim 1, wherein:

the DC index control structure is comprised of silicon nitride.

7. The laser of claim 1, wherein the Bragg grating is created by perturbations proximate the waveguide.

8. The laser of claim 7, wherein the Bragg grating is created by a series of posts proximate the waveguide.

9. The laser of claim 8, wherein the Bragg grating is created by a series of posts proximate the waveguide positioned to provide a gap between the waveguide and posts chosen to provide a Gaussian amplitude apodization of the Bragg grating.

10. The laser of claim 9, wherein:

the waveguide and the series of posts are comprised of silicon nitride.

11. The laser of claim 1, wherein:

the semiconductor gain element and waveguide are monolithically integrated on a single semiconductor substrate comprised of one of silicon, indium phosphide, and gallium arsenide.

12. The laser of claim 1, where the waveguide is a high refractive index waveguide, where the refractive index 'n' is greater than 3.

13. The laser of claim 1, wherein:

the DC index control structure is apodized proximate to at least one end of the Bragg grating.

14. The laser of claim 1, wherein:

the waveguide is included in a planar waveguide having a substrate, and wherein the Bragg grating is formed via perturbation in the substrate proximate the waveguide, and the DC index control structure is positioned in the substrate.

15. The laser of claim 1, wherein the Bragg grating has a physical length larger than 10 mm and occupies at least 50% of the optical length of the external cavity.

16. The laser of claim 1, further comprising:

a first photodetector to monitor light output from the gain element to the external cavity, and a second photodetector to monitor light reflected by the Bragg grating, wherein a ratio of the reflected light to the output light provides a feedback signal for locking the lasing mode of the gain element to a specific wavelength reflected by the Bragg grating by varying at least one of a cavity phase control section and the gain element bias current.

17. A waveguide Bragg grating comprising:

a planar substrate including a waveguide, the substrate including perturbations creating a Bragg grating in the waveguide, and a DC index control structure positioned to vary the DC index along at least a portion of the Bragg grating, wherein a distance between the DC index control structure and the waveguide varies over a length of the Bragg grating.

18. The waveguide Bragg grating of claim 17, wherein the Bragg grating is created by a series of posts proximate the waveguide positioned to provide a gap between the waveguide and posts chosen to provide a Gaussian amplitude apodization of the Bragg grating.

19. The waveguide Bragg grating of claim 18, wherein:

the waveguide and the series of posts are comprised of silicon nitride.

20. A laser comprising:

a semiconductor gain element to generate light in response to a bias current and having a first end with a high reflectivity forming a first end of a laser cavity and a second end with a lower reflectivity to allow at least a portion of light to pass through the second end; and an optical reflector including a waveguide in a planar substrate, the substrate including perturbations creating a Bragg grating in the waveguide, and a DC index control structure positioned to vary the DC index along at least a portion of the Bragg grating, wherein a distance between the DC index control structure and the waveguide varies over a length of the Bragg grating, and the waveguide coupled to the second end of the semiconductor gain element to form an external cavity having an optical length and a cavity phase.

* * * * *